United States Patent
Asano

(10) Patent No.: US 7,498,808 B2
(45) Date of Patent: Mar. 3, 2009

(54) RF PULSE APPLYING METHOD AND MRI APPARATUS

(75) Inventor: Kenji Asano, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 114 days.

(21) Appl. No.: 11/612,720

(22) Filed: Dec. 19, 2006

(65) Prior Publication Data

US 2007/0145974 A1 Jun. 28, 2007

(30) Foreign Application Priority Data

Dec. 26, 2005 (JP) ............... 2005-371504

(51) Int. Cl.
*G01V 3/00* (2006.01)
(52) U.S. Cl. ...................... 324/307; 324/309
(58) Field of Classification Search .......... 324/307, 324/309
See application file for complete search history.

(56) References Cited

U.S. PATENT DOCUMENTS

| | | | | |
|---|---|---|---|---|
| 4,924,183 A | * | 5/1990 | Kunz et al. ............ | 324/309 |
| 5,347,217 A | * | 9/1994 | Leach et al. ............ | 324/309 |
| 5,655,531 A | * | 8/1997 | Nishimura et al. ....... | 600/413 |
| 6,737,865 B2 | | 5/2004 | Asano et al. | |
| 2002/0149366 A1 | | 10/2002 | Asano et al. | |
| 2003/0160616 A1 | | 8/2003 | Asano et al. | |

* cited by examiner

*Primary Examiner*—Louis M Arana
(74) *Attorney, Agent, or Firm*—Armstrong Teasdale LLP

(57) ABSTRACT

The present invention is directed to perform T2 weighting and suppression of a signal from a specific component in short preparation pulse application time. A first 90° pulse in DE pulses is a pulse which is selectively valid for water and makes the longitudinal magnetization of water turn by 90° about the x axis as a rotation axis. A 180° pulse is a pulse which is valid for water and fat and makes the longitudinal magnetization of water and fat turn by 180° about the x axis as a rotation axis. A second 90° pulse is a pulse which is valid for water and fat and makes the longitudinal magnetization of water and fat turn by 90° about the x axis as a rotation axis. By the DE pulses, the longitudinal magnetization of water is rotated by 360°, and the effect of T2 weighting is obtained in a manner similar to the conventional DE pulses. The longitudinal magnetization of fat is rotated by 270° and does not return to the original longitudinal magnetization so that the effect of suppressing a signal is obtained. Since only application time of the DE pulses is sufficient, time required to apply a preparation pulse does not increase.

20 Claims, 3 Drawing Sheets

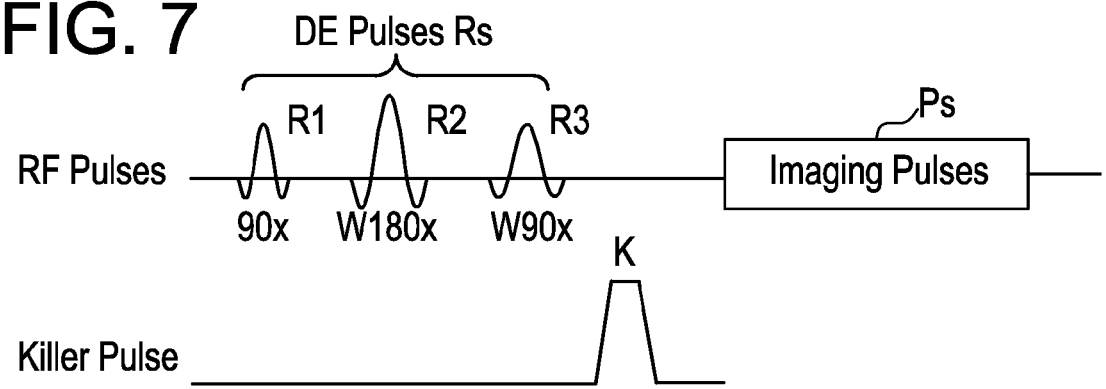
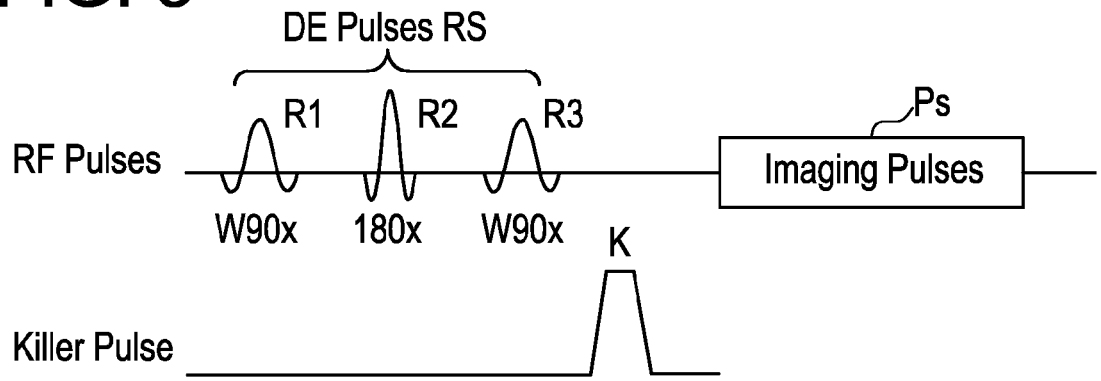

RF PULSE APPLYING METHOD AND MRI APPARATUS

CROSS REFERENCE TO RELATED APPLICATIONS

This application claims the benefit of Japanese Application No. 2005-371504 filed Dec. 26, 2005.

BACKGROUND OF THE INVENTION

The present invention relates to an RF (Radio Frequency) pulse applying method and an MRI (Magnetic Resonance Imaging) apparatus and, more particularly, to an RF pulse applying method and an MRI apparatus capable of performing T2 weighting and suppression of a signal from a specific component in short preparation pulse application time.

Hitherto, a technique for applying a DE (Driven Equilibrium) pulse used as a preparation pulse for T2 weighting is known (refer to, for example, non-patent document 1).

A technique for applying a saturation pulse for suppressing a signal from a specific component is also known (refer to, for example, non-patent document 1).

Non-Patent Document 1: "MRI/CT glossary" edited by Tsutomu Araki and Kazuro Sugimura, p2 to p3 and p101, Medical View Co., Ltd (issued on Nov. 10, 2000).

In the case of performing both T2 weighting and suppression of a signal from a specific component, it is sufficient to apply a DE pulse and a saturation pulse in order as preparation pulses.

However, when the DE pulse and the saturation pulse are applied in order, a problem occurs such that time required to apply the preparation pulses is long.

SUMMARY OF THE INVENTION

Therefore, an object of the present invention is to provide an RF pulse applying method and an MRI apparatus capable of performing the T2 weighting and suppression of a signal from a specific component in short preparation pulse application time.

According to a first aspect, the present invention provides an RF pulse applying method of applying DE pulses in which an RF pulse as a part of a pulse train that gives rotation of an integral multiple of 360° to longitudinal magnetization of a component to be measured is set as an RF pulse which does not give rotation to longitudinal magnetization of a component to be suppressed, thereby giving no rotation of an integral multiple of 360° to the longitudinal magnetization of the component to be suppressed.

In the RF pulse applying method according to the first aspect, rotation of an integral multiple of 360° is given to the longitudinal magnetization of a component to be measured, so that the effect of T2 weighting is obtained. On the other hand, no rotation of an integral multiple of 360° is given to the longitudinal magnetization of a component to be suppressed, so that the longitudinal magnetization does not return to the original one, and an effect of suppressing a signal is obtained. Since only application time of the DE pulses is sufficient, time required to apply a preparation pulse does not increase.

According to a second aspect, in the RF pulse applying method according to the first aspect, the DE pulses take the form of a pulse train of a 90° pulse, a 180° pulse, and a 90° pulse.

In the RF pulse applying method according to the second aspect, rotation of 360° is given to the longitudinal magnetization of a component to be measured, so that the longitudinal magnetization can be returned to the original longitudinal magnetization state.

According to a third aspect, in the RF pulse applying method according to the second aspect, the first 90° pulse is a pulse which is selectively valid for water, and the 180° pulse and the second 90° pulse are pulses which are valid for water and fat.

In the RF pulse applying method according to the third aspect, rotation of 360° is given to the longitudinal magnetization of a component to be measured, so that the longitudinal magnetization can be returned to the original longitudinal magnetization state. On the other hand, rotation of 270° is given to the longitudinal magnetization of a component to be suppressed, so that a signal can be suppressed by the same effect as that of a saturation pulse.

According to a fourth aspect of the invention, in the RF pulse applying method according to the second aspect, the first 90° pulse and the second 90° pulse are pulses which are valid for water and fat, and the 180° pulse is a pulse which is selectively valid for water.

In the RF pulse applying method according to the fourth aspect, rotation of 360° is given to the longitudinal magnetization of a component to be measured, so that the longitudinal magnetization can be returned to the original longitudinal magnetization state. On the other hand, rotation of 180° is given to the longitudinal magnetization of a component to be suppressed, so that a signal can be suppressed by the same effect as that of a spec IR (spectral inversion recovery) pulse.

The spec IR pulse is described in page 97 of the non-patent document 1.

According to a fifth aspect of the invention, in the RF pulse applying method according to the second aspect, the first 90° pulse and the 180° pulse are pulses which are valid for water and fat, and the second 90° pulse is a pulse which is selectively valid for water.

In the RF pulse applying method according to the fifth aspect, rotation of 360° is given to the longitudinal magnetization of a component to be measured, so that the longitudinal magnetization can be returned to the original longitudinal magnetization state. On the other hand, rotation of 270° is given to the longitudinal magnetization of a component to be suppressed, so that a signal can be suppressed by the same effect as that of a saturation pulse.

According to a sixth aspect of the invention, in the RF pulse applying method according to the second aspect, the first 90° pulse and the 180° pulse are pulses which are selectively valid for water, and the second 90° pulse is a pulse which is valid for water and fat.

In the RF pulse applying method according to the sixth aspect, rotation of 360° is given to the longitudinal magnetization of a component to be measured, so that the longitudinal magnetization can be returned to the original longitudinal magnetization state. On the other hand, rotation of 90° is given to the longitudinal magnetization of a component to be suppressed, so that a signal can be suppressed by the same effect as that of a saturation pulse.

According to a seventh aspect of the invention, in the RF pulse applying method according to the second aspect, the first 90° pulse is a pulse which is valid for water and fat, and the 180° pulse and the second 90° pulse are pulses which are selectively valid for water.

In the RF pulse applying method according to the seventh aspect, rotation of 360° is given to the longitudinal magnetization of a component to be measured, so that the longitudinal magnetization can be returned to the original longitudinal magnetization state. On the other hand, rotation of 90° is given to the longitudinal magnetization of a component to be suppressed, so that a signal can be suppressed by the same effect as that of a saturation pulse.

According to an eighth aspect of the invention, in the RF pulse applying method according to the second aspect, the first 90° pulse and the second 90° pulse are pulses which are selectively valid for water, and the 180° pulse is a pulse which is valid for water and fat.

In the RF pulse applying method according to the eighth aspect, rotation of 360° is given to the longitudinal magnetization of a component to be measured, so that the longitudinal magnetization can be returned to the original longitudinal magnetization state. On the other hand, rotation of 180° is given to the longitudinal magnetization of a component to be suppressed, so that a signal can be suppressed by the same effect as that of a spec IR pulse.

According to a ninth aspect, the present invention provides an MRI apparatus comprising DE pulse applying means for applying DE pulses in which an RF pulse as a part of a pulse train that gives rotation of an integral multiple of 360° to longitudinal magnetization of a component to be measured is set as an RF pulse which does not give rotation to longitudinal magnetization of a component to be suppressed.

The MRI apparatus according to the ninth aspect can suitably perform the RF pulse applying method according to the first aspect.

According to a tenth aspect of the invention, in the MRI apparatus according to the ninth aspect, the DE pulses take the form of a pulse train of a 90° pulse, a 180° pulse, and a 90° pulse.

The MRI apparatus according to the tenth aspect can suitably execute the RF pulse applying method according to the second aspect.

According to an eleventh aspect of the invention, in the MRI apparatus according to the tenth aspect, the first 90° pulse is a pulse which is selectively valid for water, and the 180° pulse and the second 90° pulse are pulses which are valid for water and fat.

The MRI apparatus according to the eleventh aspect can suitably execute the RF pulse applying method according to the third aspect.

According to a twelfth aspect of the invention, in the MRI apparatus according to the tenth aspect, the first 90° pulse and the second 90° pulse are pulses which are valid for water and fat, and the 180° pulse is a pulse which is selectively valid for water.

The MRI apparatus according to the twelfth aspect can suitably execute the RF pulse applying method according to the fourth aspect.

According to a thirteenth aspect of the invention, in the MRI apparatus according to the tenth aspect, the first 90° pulse and the 180° pulse are pulses which are valid for water and fat, and the second 90° pulse is a pulse which is selectively valid for water.

The MRI apparatus according to the thirteenth aspect can suitably execute the RF pulse applying method according to the fifth aspect.

According to a fourteenth aspect of the invention, in the MRI apparatus according to the tenth aspect, the first 90° pulse and the 180° pulse are pulses which are selectively valid for water, and the second 90° pulse is a pulse which is valid for water and fat.

The MRI apparatus according to the fourteenth aspect can suitably execute the RF pulse applying method according to the sixth aspect.

According to a fifteenth aspect of the invention, in the MRI apparatus according to the tenth aspect, the first 90° pulse is a pulse which is valid for water and fat, and the 180° pulse and the second 90° pulse are pulses which are selectively valid for water.

The MRI apparatus according to the fifteenth aspect can suitably execute the RF pulse applying method according to the seventh aspect.

According to a sixteenth aspect of the invention, in the MRI apparatus according to the tenth aspect, the first 90° pulse and the second 90° pulse are pulses which are selectively valid for water, and the 180° pulse is a pulse which is valid for water and fat.

The MRI apparatus according to the sixteenth aspect can suitably execute the RF pulse applying method according to the eighth aspect.

The RF pulse applying method and the MRI apparatus of the invention can perform T2 weighting and suppression of a signal from a specific component in short time.

The RF pulse applying method and the MRI apparatus of the present invention can be used, for example, to acquire a T2-weighted MR image of water while suppressing fat.

Further objects and advantages of the present invention will be apparent from the following description of the preferred embodiments of the invention as illustrated in the accompanying drawings.

BRIEF DESCRIPTION OF THE DRAWINGS

FIG. 7 is a time chart showing DE pulses and imaging pulses in a fifth embodiment.

FIG. 8 is a time chart showing DE pulses and imaging pulses in a sixth embodiment.

DETAILED DESCRIPTION OF THE INVENTION

Figure 1:
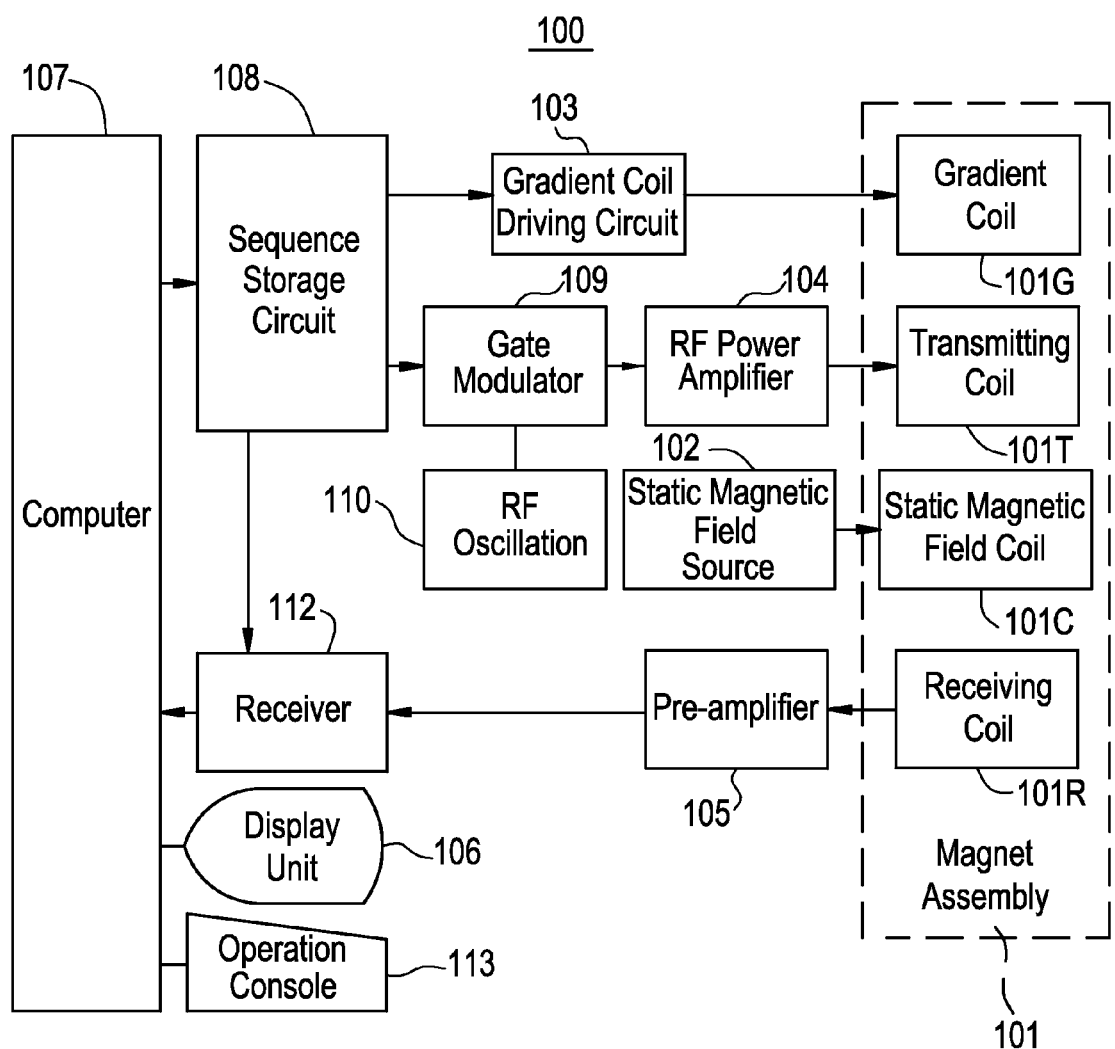
FIG. 1 is a block diagram showing the configuration of an MRI apparatus according to a first embodiment.

The present invention will be described more specifically hereinbelow by using embodiments shown in the drawings. The invention, however, is not limited to the embodiments.

First Embodiment

FIG. 1 is a block diagram showing an MRI apparatus 100 according to a first embodiment.

In the MRI apparatus 100, a magnet assembly 101 has therein a space (bore) in which a subject is inserted. A static magnetic field coil 101C for applying a predetermined static magnetic field to the subject, a gradient coil 101G for generating gradient magnetic fields of X axis, Y axis, and Z axis, a transmission coil 101T for supplying an RF pulse for exciting spins of atomic nucleuses in the subject, and a reception coil 101R for receiving an NMR signal from the subject are arranged so as to surround the space.

Both of the transmission coil 101T and the reception coil 101R may be body coils. There is also a case such that the transmission coil 101T is a body coil and the reception coil 101R is a surface coil.

The static magnetic field coil 101C is connected to a static magnetic field power source 102. The gradient coil 101G is connected to a gradient coil driving circuit 103. The transmission coil 101T is connected to an RF power amplifier 104. The reception coil 101R is connected to a preamplifier 105.

A permanent magnet may be used in place of the static magnetic field coil 101.

According to an instruction from a computer 107, a sequence storage circuit 108 operates the gradient coil driving circuit 103 on the basis of a stored pulse sequence to generate a gradient magnetic field from the gradient coil 101G. The sequence storage circuit 108 also operates a gate modulation circuit 109 to modulate a carrier wave output signal of an RF oscillation circuit 110 to a pulse signal having a predetermined timing, a predetermined envelope shape, and a predetermined phase, adds the pulse signal as an RF pulse to the RF power amplifier 104 where the pulse signal is subjected to power amplification and, after that, applies the amplified signal to the transmission coil 101T.

A receiver 112 converts the NMR signal to a digital signal and inputs the digital signal to the computer 107.

The computer 107 reads the digital signal from the receiver 112 and processes the read signal, thereby generating an MR image. The computer 107 performs a general control such as reception of information entered from an operator console 113.

A display 106 displays an image and a message.

Figure 2:
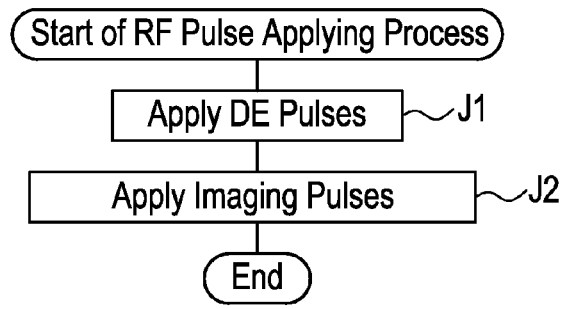
FIG. 2 is a flowchart showing an RF pulse applying process according to the first embodiment.

FIG. 2 is a flowchart showing an RF pulse applying process according to the first embodiment.

Figure 3:
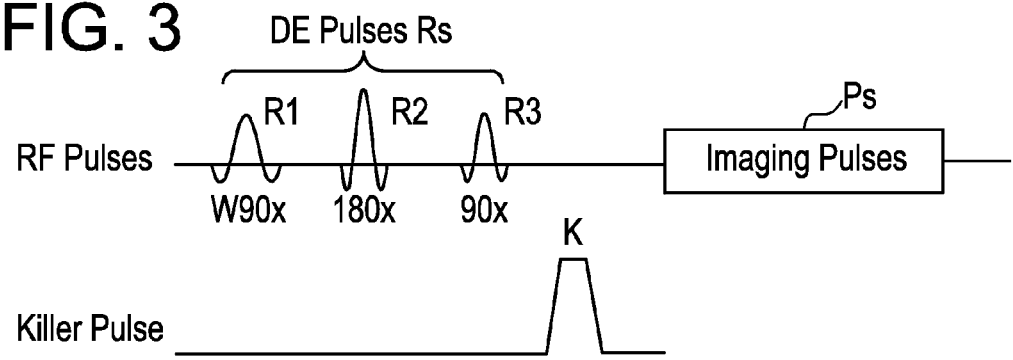
FIG. 3 is a time chart showing DE pulses and imaging pulses in the first embodiment.

In step J1, DE pulses Rs are applied as shown in FIG. 3.

The DE pulses Rs shown in FIG. 3 are a pulse train of a 90° pulse R1, a 180° pulse R2, and a 90° pulse R3. The first 90° pulse R1 is a pulse which is selectively valid for water and makes the longitudinal magnetization of water turn by 90° about the x axis as a rotation axis. This is expressed as "W90x" in FIG. 3. The 180° pulse R2 is a pulse which is valid for water and fat and makes the longitudinal magnetization of water and fat turn by 180° about the x axis as a rotation axis. This is expressed as "180x" in FIG. 3. The second 90° pulse R3 is a pulse which is valid for water and fat and makes the longitudinal magnetizations of water and fat turn by 90° about the x axis as a rotation axis. This is expressed as "90x" in FIG. 3. Therefore, by the DE pulses Rs, the longitudinal magnetization of water is rotated 360°, and that of fat is rotated 270°. After the DE pulses Rs, a killer pulse K is applied to an arbitrary axis.

Referring again to FIG. 2, in step J2, imaging pulses Ps are applied as shown in FIG. 3, and data for imaging is acquired. A pulse sequence for acquiring the imaging data is, for example, a gradient echo pulse sequence.

By the MRI apparatus 100 of the first embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates 270° and does not recover to the original longitudinal magnetization, so that the effect of suppressing a signal is obtained.

(3) Since only the application time of the DE pulses Rs is sufficient, the time required to apply preparation pulses does not increase.

As a modification, another pulse train of RF pulses "W90x", "180y", and "−90x" may be used. Specifically, the pulse train is made of an RF pulse that makes the longitudinal magnetization of water turn by 90° about the x axis as a rotation axis, an RF pulse that makes the longitudinal magnetization of water and fat turn by 180° about the y axis as a rotation axis, and an RF pulse that makes the longitudinal magnetization of water and fat turn by −90° about the x axis as a rotation axis.

Another pulse train of RF pulses "W100x", "180x", and "80x" may be also used. Specifically, the pulse train is made of an RF pulse that makes the longitudinal magnetization of water turn by 100° about the x axis as a rotation axis, an RF pulse that makes the longitudinal magnetization of water and fat turn by 180° about the x axis as a rotation axis, and an RF pulse that makes the longitudinal magnetization of water and fat turn by 80° about the x axis as a rotation axis.

Second Embodiment

Figure 4:
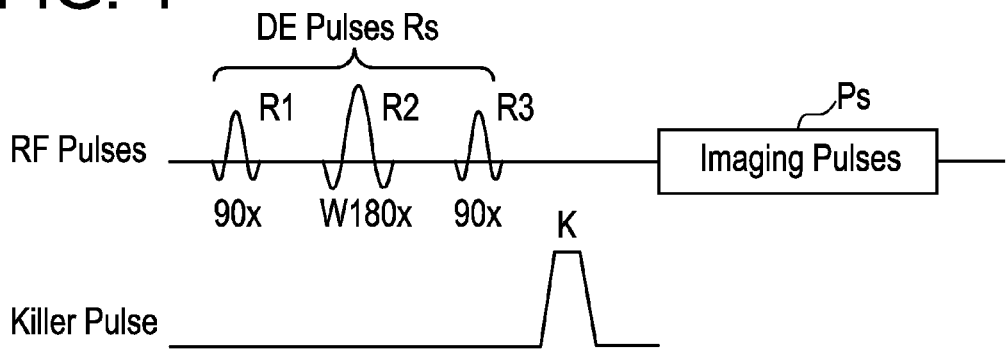
FIG. 4 is a time chart showing DE pulses and imaging pulses in a second embodiment.

DE pulses Rs as shown in FIG. 4 may be also used.

The DE pulses Rs shown in FIG. 4 are a pulse train of a 90° pulse R1, a 180° pulse R2, and a 90° pulse R3. The first 90° pulse R1 is a pulse which is valid for water and fat and makes the longitudinal magnetization of water and fat turn by 90° about the x axis as a rotation axis. This is expressed as "90x" in FIG. 4. The 180° pulse R2 is a pulse which is selectively valid for water and makes the longitudinal magnetization of water turn by 180° about the x axis as a rotation axis. This is expressed as "W180x" in FIG. 4. The second 90° pulse R3 is a pulse which is valid for water and fat and makes the longitudinal magnetization of water and fat turn by 90° about the x axis as a rotation axis. This is expressed as "90x" in FIG. 4. Therefore, by the DE pulses Rs, the longitudinal magnetization of water is rotated by 360°, and that of fat is rotated by 180°. After the DE pulses Rs, a killer pulse K is applied to an arbitrary axis.

By the MRI apparatus 100 of the second embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates by 180° and a signal of fat can be suppressed by the same effect as that of the conventional spec IR pulse.

(3) Since only the application time of the DE pulse Rs is sufficient, the time required to apply a preparation pulse does not increase.

Third Embodiment

Figure 5:
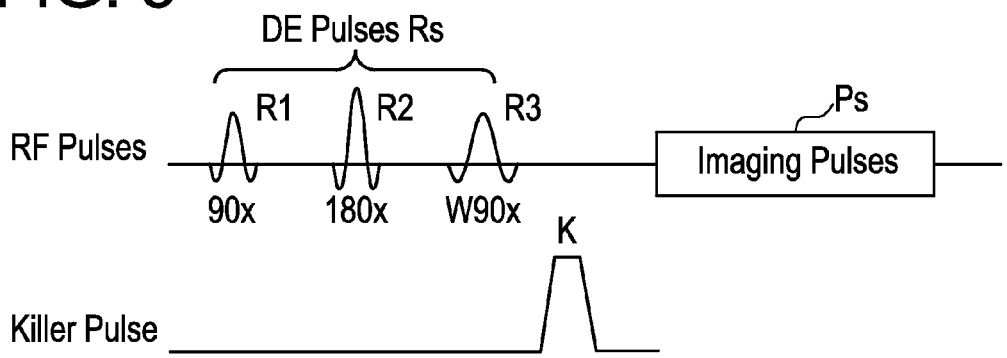
FIG. 5 is a time chart showing DE pulses and imaging pulses in a third embodiment.

DE pulses Rs as shown in FIG. 5 may be used.

The DE pulses Rs shown in FIG. 5 are a pulse train of a 90° pulse R1, a 180° pulse R2, and a 90° pulse R3. The first 90° pulse R1 is a pulse which is valid for water and fat and makes the longitudinal magnetization of water and fat turn by 90° about the x axis as a rotation axis. This is expressed as "90x" in FIG. 5. The 180° pulse R2 is a pulse which is valid for water and fat and makes the longitudinal magnetization of water and fat turn by 180° about the x axis as a rotation axis. This is expressed as "180x" in FIG. 5. The second 90° pulse R3 is a pulse which is selectively valid for water and makes the longitudinal magnetization of water turn by 90° about the x axis as a rotation axis. This is expressed as "W90x" in FIG. 5. Therefore, by the DE pulses Rs, the longitudinal magnetization of water is rotated by 360°, and that of fat is rotated by 270°. After the DE pulses Rs, a killer pulse K is applied to an arbitrary axis.

By the MRI apparatus of the third embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates by 270° and does not recover to the original longitudinal magnetization, so that the effect of suppressing a signal is obtained.

(3) Since only the application time of the DE pulse Rs is sufficient, the time required to apply a preparation pulse does not increase.

As a modification, another pulse train of RF pulses "90x", "180y", and "W−90x" may be used. Specifically, the pulse train is made of an RF pulse that makes the longitudinal magnetization of water and fat turn by 90° about the x axis as a rotation axis, an RF pulse that makes the longitudinal magnetization of water and fat turn by 180° about the y axis as a rotation axis, and an RF pulse that makes the longitudinal magnetization of water turn by −90° about the x axis as a rotation axis.

Fourth Embodiment

Figure 6:
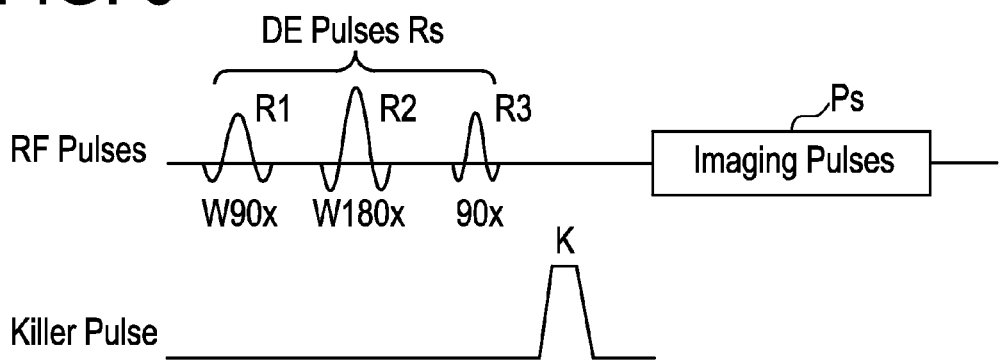
FIG. 6 is a time chart showing DE pulses and imaging pulses in a fourth embodiment.

DE pulses Rs as shown in FIG. 6 may be also used.

The DE pulses Rs shown in FIG. 6 are a pulse train of a 90° pulse R1, a 180° pulse R2, and a 90° pulse R3. The first 90° pulse R1 is a pulse which is selectively valid for water and makes the longitudinal magnetization of water turn by 90° about the x axis as a rotation axis. This is expressed as "W90x" in FIG. 6. The 180° pulse R2 is a pulse which is selectively valid for water and makes the longitudinal magnetization of water turn by 180° about the x axis as a rotation axis. This is expressed as "W180x" in FIG. 6. The second 90° pulse R3 is a pulse which is valid for water and fat and makes the longitudinal magnetization of water and fat turn by 90° about the x axis as a rotation axis. This is expressed as "90x" in FIG. 6. Therefore, by the DE pulses Rs, the longitudinal magnetization of water is rotated by 360°, and that of fat is rotated by 90°. After the DE pulses Rs, a killer pulse K is applied to an arbitrary axis.

By the MRI apparatus of the fourth embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates by 90° and does not recover to the original longitudinal magnetization, so that the effect of suppressing a signal is obtained.

(3) Since only the application time of the DE pulses Rs is sufficient, the time required to apply a preparation pulse does not increase.

Fifth Embodiment

DE pulses Rs as shown in FIG. 7 may be also used.

The DE pulses Rs shown in FIG. 7 are a pulse train of a 90° pulse R1, a 180° pulse R2, and a 90° pulse R3. The first 90° pulse R1 is a pulse which is valid for water and fat and makes the longitudinal magnetization of water and fat turn by 90° about the x axis as a rotation axis. This is expressed as "90x" in FIG. 7. The 180° pulse R2 is a pulse which is selectively valid for water and makes the longitudinal magnetization of water turn by 180° about the x axis as a rotation axis. This is expressed as "W180x" in FIG. 7. The second 90° pulse R3 is a pulse which is selectively valid for water and makes the longitudinal magnetization of water turn by 90° about the x axis as a rotation axis. This is expressed as "W90x" in FIG. 7. Therefore, by the DE pulses Rs, the longitudinal magnetization of water is rotated by 360°, and that of fat is rotated by 90°. After the DE pulses Rs, a killer pulse K is applied to an arbitrary axis.

By the MRI apparatus of the fifth embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates by 90° and does not recover to the original longitudinal magnetization, so that the effect of suppressing a signal is obtained.

(3) Since only the application time of the DE pulse Rs is sufficient, the time required to apply a preparation pulse does not increase.

Sixth Embodiment

DE pulses Rs as shown in FIG. 8 may be also used.

The DE pulses Rs shown in FIG. 8 are a pulse train of a 90° pulse R1, a 180° pulse R2, and a 90° pulse R3. The first 90° pulse R1 is a pulse which is selectively valid for water and makes the longitudinal magnetization of water turn by 90° about the x axis as a rotation axis. This is expressed as "W90x" in FIG. 8. The 180° pulse R2 is a pulse which is valid for water and fat and makes the longitudinal magnetization of water and fat turn by 180° about the x axis as a rotation axis. This is expressed as "180x" in FIG. 8. The second 90° pulse R3 is a pulse which is selectively valid for water and makes the longitudinal magnetization of water turn by 90° about the x axis as a rotation axis. This is expressed as "W90x" in FIG. 8. Therefore, by the DE pulses Rs, the longitudinal magnetization of water is rotated by 360°, and that of fat is rotated by 180°. After the DE pulses Rs, a killer pulse K is applied to an arbitrary axis.

By the MRI apparatus of the sixth embodiment, the following effects are obtained.

(1) The longitudinal magnetization of water is rotated by 360° by the DE pulses Rs, and the effect of T2 weighting is obtained in a manner similar to the conventional DE pulses.

(2) The longitudinal magnetization of fat rotates by 180°, and the effect of suppressing a signal is obtained by the same effect as that of the conventional spec IR pulse.

(3) Since only the application time of the DE pulse Rs is sufficient, the time required to apply a preparation pulse does not increase.

As a modification, another pulse train of RF pulses "W90x", "180y", and "W−90x" may be used. Specifically, the pulse train is made of an RF pulse that makes the longitudinal magnetization of water turn by 90° about the x axis as a rotation axis, an RF pulse for making the longitudinal magnetization of water and fat turn by 180° about the y axis as a rotation axis, and an RF pulse which makes the longitudinal magnetization of water turn by −90° about the x axis as a rotation axis.

Many widely different embodiments of the invention may be configured without departing from the spirit and scope of the present invention. It should be understood that the present invention is not limited to the specific embodiments described in the specification, except as defined in the appended claims.

The invention claimed is:

1. A radio frequency (RF) pulse applying method of applying driven equilibrium (DE) pulses in which an RF pulse as a part of a pulse train that induces rotation of an integral multiple of 360° to longitudinal magnetization of a component to be measured is set as an RF pulse which does not induce rotation to longitudinal magnetization of a component to be suppressed, such that no rotation of an integral multiple of 360° is induced to the longitudinal magnetization of the component to be suppressed.

2. The RF pulse applying method according to claim 1, wherein the DE pulses take the form of a pulse train of a first 90° pulse, a 180° pulse, and a second 90° pulse.

3. The RF pulse applying method according to claim 2, wherein the first 90° pulse is a pulse which is selectively valid for water, and the 180° pulse and the second 90° pulse are pulses which are valid for water and fat.

4. The RF pulse applying method according to claim 2, wherein the first 90° pulse and the second 90° pulse are pulses which are valid for water and fat, and the 180° pulse is a pulse which is selectively valid for water.

5. The RF pulse applying method according to claim 2, wherein the first 90° pulse and the 180° pulse are pulses which are valid for water and fat, and the second 90° pulse is a pulse which is selectively valid for water.

6. The RF pulse applying method according to claim 2, wherein the first 90° pulse and the 180° pulse are pulses which are selectively valid for water, and the second 90° pulse is a pulse which is valid for water and fat.

7. The RF pulse applying method according to claim 2, wherein the first 90° pulse is a pulse which is valid for water and fat, and the 180° pulse and the second 90° pulse are pulses which are selectively valid for water.

8. The RF pulse applying method according to claim 2, wherein the first 90° pulse and the second 90° pulse are pulses which are selectively valid for water, and the 180° pulse is a pulse which is valid for water and fat.

9. A magnetic resonance imaging (MRI) apparatus comprising a driven equilibrium (DE) pulse applying device for applying DE pulses in which a radio frequency (RF) pulse as a part of a pulse train that induces rotation of an integral multiple of 360° to longitudinal magnetization of a component to be measured is set as an RF pulse which does not induce rotation to longitudinal magnetization of a component to be suppressed.

10. The MRI apparatus according to claim 9, wherein the DE pulses take the form of a pulse train of a first 90° pulse, a 180° pulse, and a second 90° pulse.

11. The MRI apparatus according to claim 10, wherein the first 90° pulse is a pulse which is selectively valid for water, and the 180° pulse and the second 90° pulse are pulses which are valid for water and fat.

12. The MRI apparatus according to claim 10, wherein the first 90° pulse and the second 90° pulse are pulses which are valid for water and fat, and the 180° pulse is a pulse which is selectively valid for water.

13. The MRI apparatus according to claim 10, wherein the first 90° pulse and the 180° pulse are pulses which are valid for water and fat, and the second 90° pulse is a pulse which is selectively valid for water.

14. The MRI apparatus according to claim 10, wherein the first 90° pulse and the 180° pulse are pulses which are selectively valid for water, and the second 90° pulse is a pulse which is valid for water and fat.

15. The MRI apparatus according to claim 10, wherein the first 90° pulse is a pulse which is valid for water and fat, and the 180° pulse and the second 90° pulse are pulses which are selectively valid for water.

16. The MRI apparatus according to claim 10, wherein the first 90° pulse and the second 90° pulse are pulses which are selectively valid for water, and the 180° pulse is a pulse which is valid for water and fat.

17. A method for applying a radio frequency (RF) pulse, said method comprising:
applying a pulse train of at least one 90° pulse and at least one 180° pulse in which an RF pulse that induces rotation to a longitudinal magnetization of a component to be measured is set as an RF pulse that does not induce rotation to a longitudinal magnetization of a component to be suppressed.

18. The method according to claim 17, wherein a first 90° pulse is a pulse which is selectively valid for water, and a 180° pulse and a second 90° pulse are pulses which are valid for water and fat.

19. The method according to claim 17, wherein a first 90° pulse and a second 90° pulse are pulses which are valid for water and fat, and a 180° pulse is a pulse which is selectively valid for water.

20. The method according to claim 17, wherein a first 90° pulse and a 180° pulse are pulses which are valid for water and fat, and a second 90° pulse is a pulse which is selectively valid for water.

* * * * *